United States Patent
Dunning et al.

(10) Patent No.: US 7,113,562 B1
(45) Date of Patent: Sep. 26, 2006

(54) METHOD AND APPARATUS FOR RECEIVING DATA BASED ON TRACKING ZERO CROSSINGS

(75) Inventors: David S. Dunning, Portland, OR (US); Chamath Abhayagunawardhana, Portland, OR (US); Kenneth Drottar, Portland, OR (US); Richard S. Jensen, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 927 days.

(21) Appl. No.: 09/749,270

(22) Filed: Dec. 27, 2000

(51) Int. Cl.
*H03D 3/24* (2006.01)
*H04L 7/02* (2006.01)

(52) U.S. Cl. .................... 375/373; 375/360

(58) Field of Classification Search ............... 375/226, 375/360, 373, 375; 327/12; 370/421, 463–465; 708/300; 710/71
See application file for complete search history.

(56) References Cited

U.S. PATENT DOCUMENTS

| | | | | |
|---|---|---|---|---|
| 4,577,335 A | * | 3/1986 | Wong et al. ............... 375/332 |
| 5,052,027 A | * | 9/1991 | Poklemba et al. .......... 375/350 |
| 5,182,761 A | * | 1/1993 | Beyer et al. ............... 375/373 |
| 5,216,696 A | * | 6/1993 | Poklemba .................. 375/346 |
| 5,602,882 A | * | 2/1997 | Co et al. ................... 375/372 |
| 5,684,805 A | * | 11/1997 | Brown ....................... 370/518 |
| 5,905,769 A | * | 5/1999 | Lee et al. .................. 375/376 |
| 5,943,378 A | * | 8/1999 | Keba et al. ................ 375/373 |
| 6,072,370 A | * | 6/2000 | Nakamura .................. 331/25 |
| 6,151,356 A | * | 11/2000 | Spagnoletti et al. ....... 375/226 |
| 6,218,869 B1 | * | 4/2001 | Hongbin Hao et al. ..... 327/24 |
| 6,341,355 B1 | * | 1/2002 | Rutherford et al. ........ 713/501 |
| 6,584,163 B1 | * | 6/2003 | Myers, Jr. et al. ......... 375/360 |
| 6,606,360 B1 | * | 8/2003 | Dunning et al. ............ 375/354 |
| 6,665,359 B1 | * | 12/2003 | Flake ........................ 375/354 |
| 6,680,970 B1 | * | 1/2004 | Mejia ........................ 375/225 |

* cited by examiner

*Primary Examiner*—Amanda T. Le
*Assistant Examiner*—Lawrence B. Williams
(74) *Attorney, Agent, or Firm*—Blakely, Sokoloff, Taylor & Zafman LLP

(57) ABSTRACT

Conventional receiver architectures are based on either frequency/phase tracking or oversampling. Both receiver types typically employ sensitive analog circuits, which create noise, consume power and utilize valuable space in their implementation. The invention adopts a novel approach to phase/frequency tracking that utilizes the edges or zero crossings of the input data waveform to effectively track the remote transmitter clock phase/frequency. This methodology minimizes the use of analog circuitry, thereby reducing the noise domain and the substrate space required for implementation of a tracking device.

16 Claims, 6 Drawing Sheets

High Level Block Diagram of Edge Based Receiver for 2.5Gb/s Operation

High Level Block Diagram of Edge Based Receiver for 2.5Gb/s Operation

Edge Processing Block Diagram

Tracking Clock Unit (TCU) Block Diagram

Barrel Shifter for Phase Tracking

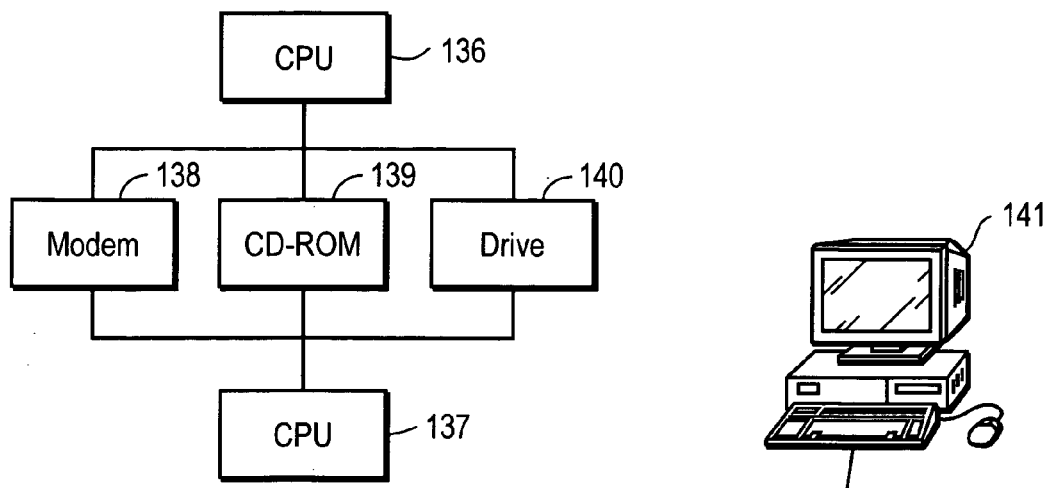
FIG. 6a
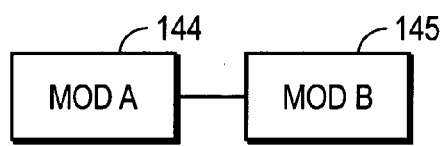
FIG. 6c
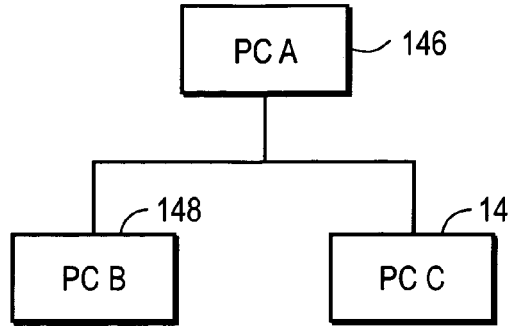
FIG. 6d
FIG. 6b

METHOD AND APPARATUS FOR RECEIVING DATA BASED ON TRACKING ZERO CROSSINGS

FIELD OF THE INVENTION

The invention relates generally to communication systems and receivers, and more particularly to a communication system and receiver for use in high-speed data transmission, such as that between servers.

BACKGROUND OF THE INVENTION

Common receiver architectures for high-speed serial data transmission are often based on either frequency/phase tracking or over-sampling. Each of these types is discussed below.

Tracking Receivers

A tracking receiver operates by locking on to the frequency and phase of the incoming data. Frequency/phase tracking is accomplished using a feedback loop, which generates frequency and phase control signals to a clock synthesizer. A typical tracking receiver recovers the clock embedded in the incoming data. It then uses the recovered clock to sample the data bits. In the lock condition, the tracking circuit continuously aligns the local clock phase to the edges observed in the recovered waveform. The recovered data is clocked in to a First-In-First Out (FIFO) buffer, which is read out synchronously relative to a local clock.

Oversampling Receivers

In an over-sampling receiver, the input data signal is sampled at a certain multiple (e.g., three times the data rate) of the nominal data rate. The local clock is nearly equal to the speed of the transmit data clock. However, an over-sampling receiver does not require the local clock to track the transmit data clock. The input signal is sampled during periodic time windows. The resulting sample bits, which occur during multiple phases of a local clock, are re-synchronized to a single clock phase. The sampled bits are then fed to a phase selection logic, which picks the best samples for the data bits within that sampling window.

Both the tracking and over-sampling receivers have some drawbacks. Tracking receivers require analog circuits that are particularly sensitive to noise. Often, the designs of tracking receivers are large and/or need additional power to function correctly in integrated circuits that contain a large amount of high frequency digital logic circuitry. Extreme care must be taken during layout, at both the chip level and board level, for receivers that contain sensitive and unduly large analog circuits. This is due to the possibility of noise sources caused by high-speed switching occurring in the digital logic. Consequently, circuit designers employ various techniques to lessen the impact of these noise sources on the sensitive analog circuits. However these techniques often result in increased circuit costs (both in size and investment).

In general, over-sampling receivers contain a much higher percentage of digital circuitry than tracking receivers, and therefore, theoretically should be more tolerant of noise. However, the over-sampling protocol introduces an additional source of jitter, called quantization jitter, due to the uncertainty associated with the sampled data. Quantization jitter effectively reduces the system level noise margins. As the rate of over-sampling is often much faster than the data rate, the speed of the digital logic limits the overall speed of the communication process to a much lower rate than otherwise possible using a tracking receiver. As a consequence, very high-speed receivers usually employ analog phase-locked loop circuits to enable operation of the receiver close to the limit of the digital circuitry.

The invention is therefore directed to the problem of developing a method and apparatus for communicating at high speeds without introducing noise by requiring analog elements on an otherwise digital circuit.

BRIEF DESCRIPTION OF THE DRAWINGS

FIGS. 6a–d depict systems in which the embodiments of the invention are applicable.

DETAILED DESCRIPTION

Figure 1:
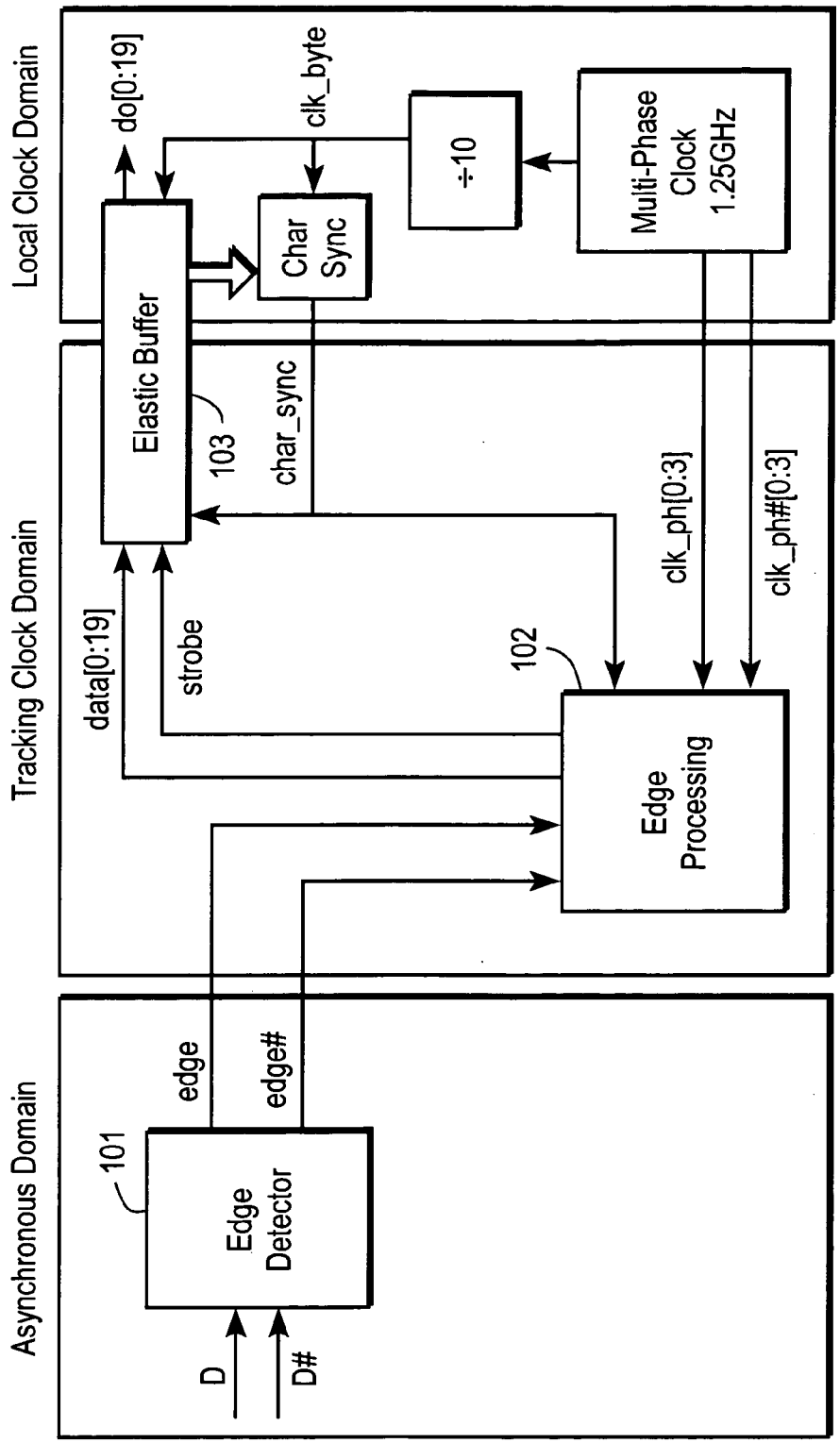
FIG. 1 depicts a block diagram of an exemplary embodiment of an edge-based receiver according to one aspect of the invention.

The invention solves the above mentioned problems and others by providing a method and apparatus for receiving data that employs an edge processor operative to make decisions using edges in the received data stream, a multi-phase clock outputting multiple clock phases, and a digital averager coupled to the edge processor and the multi-phase clock and operative to select one of the plurality of clock phases for use by the edge processor.

It is worthy to note that any reference herein to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The embodiments of the invention include inter alia a method and apparatus for receiving data that bases its decisions on edges observed in a received waveform, which method and apparatus include a digital averager to select one of a plurality of locally-generated clock phases from multi-phase clock. The selected phase is used in the receiver decision process.

According to one other aspect of the invention, one exemplary embodiment of the digital averager includes a barrel shifter. The barrel shifter enables a quick way of selecting the phase to be used in the decision process.

The edge-based receiver, in which the barrel shifter is disposed, includes a multiphasic clock generator that runs plesiochronously with respect to the transmit clock. The edge-based receiver operates by detecting zero crossings or edges of the input data waveform. Zero crossings are those time instances where the two differential input signals cross each other, i.e., when the amplitudes of the two differential signals are equal and transitioning from one state to the other. By simply looking at the edges of the received waveform, the receiver effectively reconstructs the transmitted bits synchronous relative to a local clock. The reconstructed waveform is decoded in the normal manner.

The barrel shifter of the invention operates as a digital averager in the Tracking Clock Unit (TCU) of the receiver by maintaining a mean (or average) zero crossing position based on the tracked edges of the transmitted data stream. The barrel shifter thereby operates as a phase selection device, in which one of the multiple phases is selected based on a determination of the mean (or average) zero crossings resulting from the edge tracking. This methodology eliminates the need for analog circuitry for phase tracking and selection, which is common in prior art devices, such as Phase Locked Loops (PLLs). By avoiding the use of analog devices, the invention enables higher-speed, noise insensitive receivers and data communications.

Accordingly, one advantage of the embodiments of the invention are that they provide a method, system and apparatus for tracking the phase of serial communication in a receiver using completely digital circuitry, thereby eliminating cumbersome and nosie sensitive analog circuitry. Another advantage of the embodiments are that they utilize the receiver's own clock as a clock source, thereby saving power. Yet, another advantage of the embodiments that incorporate the barrel shifter is that these embodiments are much smaller than prior art devices utilizing an analog device.

Yet another advantage of the invention is that the digital circuitry of the barrel shifter is repeatable as a macro from one silicon generation to another without the need for reinvention or redesign with every subsequent silicon generation as is common in prior art, analog-circuit driven devices.

The invention provides a technique for phase tracking in a receiver by the implementation of a barrel shifter as a digital averager. To better understand this functionality, we first present an overview of an edge-based receiver and edge processing.

Overview of an Edge Based Receiver Embodiment

The edge-based receiver operates by detecting the time instances where the two differential input signals cross each other, referred to as zero crossings correct time instances to sample the data. The tracking clock domain tracks the slow variations of the remote transmitter clock by using a phase picking mechanism provided by the invention.

Referring now in detail to the various drawings, there is shown in FIG. 1 a block diagram of an edge based receiver, which is divided into three main sections operatively connected to one another—an Edge Detector section 101, an Edge Processing section 102 and an Elastic Buffer section 103. Edge buffering occurs in the edge detector section 101 that consists of a differential amplifier followed by a divide-by-2 circuit. This section operates asynchronously with respect to the local clock and ensures that no edges are missed during edge detection.

The Edge Processing Section 102 has two major functions. First, it provides a tracking clock. In order to operate properly, the receiver needs a clock, which is approximately aligned with the transmitter clock, both in frequency and phase. Frequency alignment within certain bounds will be guaranteed by a system specification.

Figure 2:
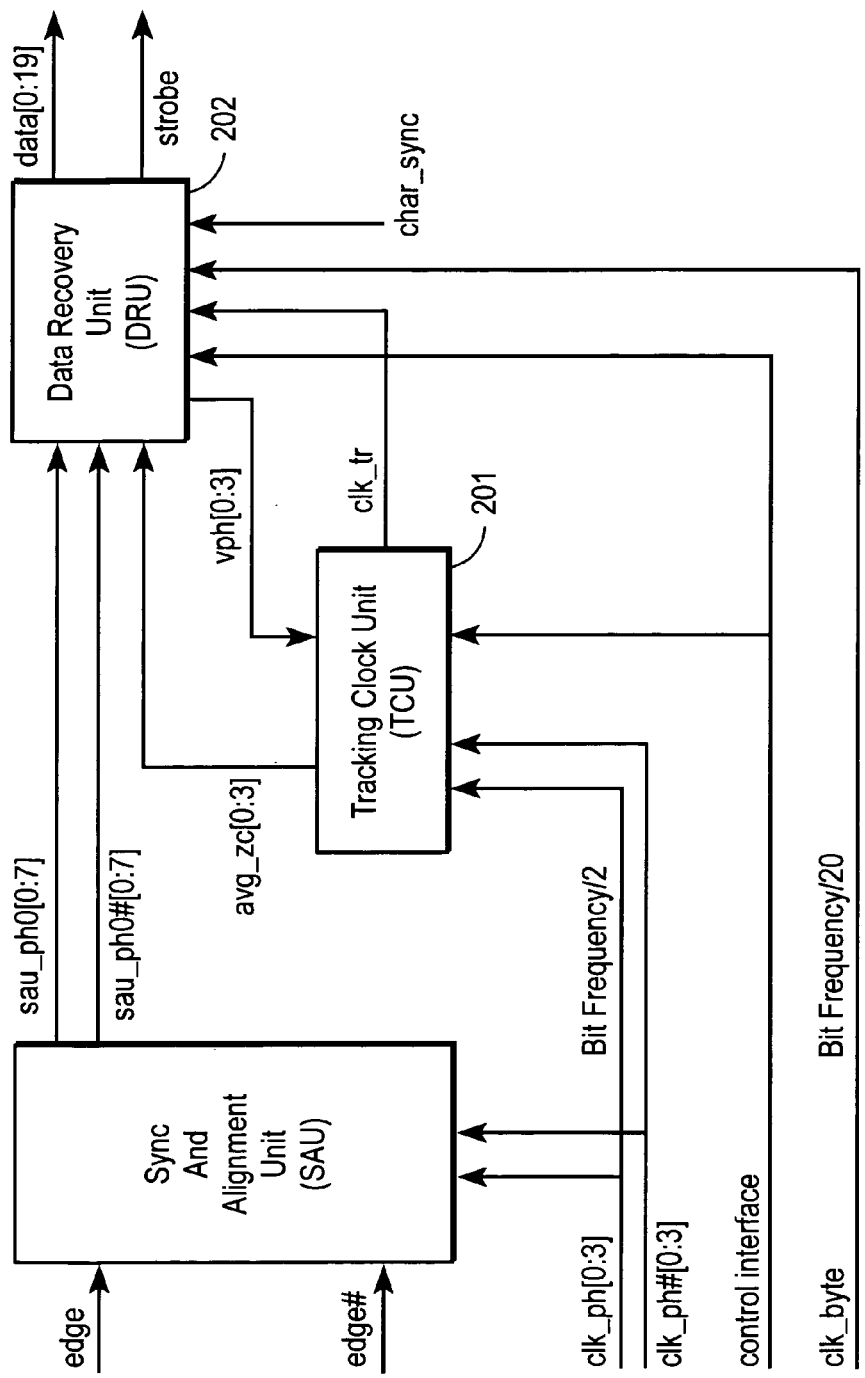
FIG. 2 depicts a block diagram of an exemplary embodiment of an edge processing section of an edge-based receiver according to another aspect of the invention.

For estimating the phase of the transmit clock and with reference to FIG. 2, the barrel shifter of the invention is employed to average the zero crossings in the Tracking Clock Unit 201. The mean zero crossing information is used by the tracking clock unit 201 to provide a clock signal clk_tr, required to establish the bit boundaries.

The second function of the Edge Processing Section 102 of FIG. 1 is data recovery, which, with reference to FIG. 2, is performed in the Data Recovery Unit (DRU) 202. The DRU 202 also provides the TCU 201 with votes vph[0:3], which indicate where the edges happened with respect to four equally spaced phases of the tracking clock. While four phases are used in this embodiment, other numbers are possible depending upon the desired granularity and accuracy required by the receiver.

A Sync and Alignment unit (SAU) 203 is also provided in the Edge Processing Section 102 of FIG. 1. As shown in FIG. 2, the SAU 203 will first synchronize the edge signals edge and edge# entering the Edge Processing Section 102 of FIG. 1 from the asynchronous domain to the local clock domain. The operation of the SAU 203 produces signals sau_ph0[0:7] and sau_ph0#[0:7], respectively.

As mentioned previously, the invention includes a barrel shifter implemented as a digital averager for tracking the clock phase and frequency of the remote transmitter. The underlying theory for this implementation is as follows.

The temporal information of the zero crossings in a transmitted bit stream varies according to the total jitter to which the receiver is subjected. The total jitter to which the receiver is subjected consists of Deterministic Jitter (DJ) introduced by the channel and Random Jitter (RJ), which is primarily caused by the transmitter clock. RJ is unpredictable, whereas DJ is data dependent. Some zero crossings are more affected by jitter than others, depending on the resultant of the DJ and RJ vectors. The edge based receiver architecture subtracts the DJ component associated with the edges of a transmitted bit stream by using the data history. The architecture also averages out the remaining RJ component by maintaining a moving average. By averaging the zero crossings, the remote transmitter clock/phase frequency can be effectively tracked.

Figure 3:
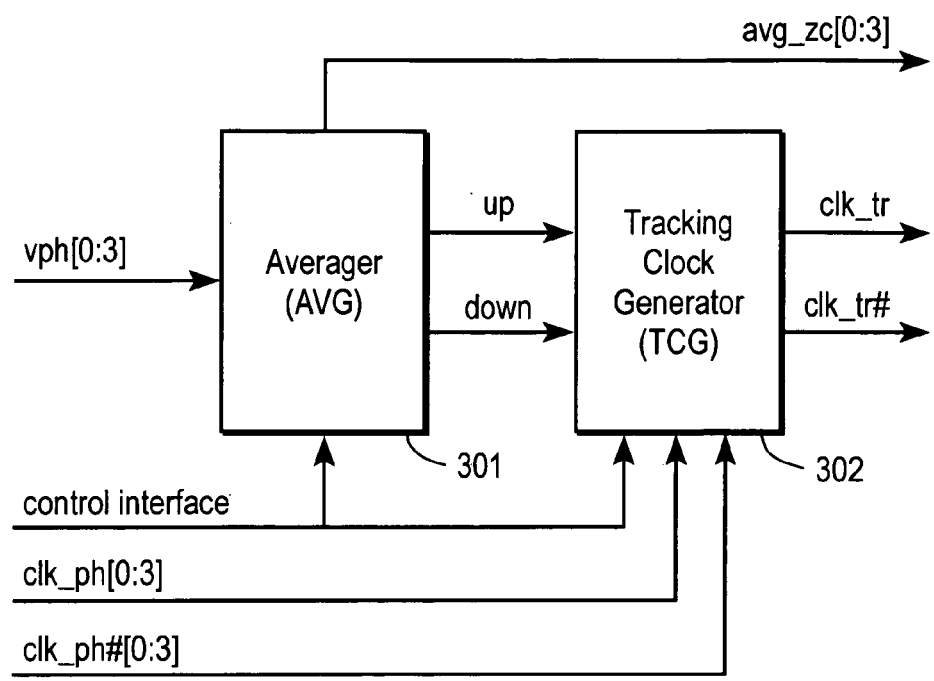
FIG. 3 depicts a block diagram of an exemplary embodiment of an averager section of a Tracking Clock Unit in accordance with yet another aspect of the invention.

Referring now to FIG. 3, shown therein is a detailed block diagram of the Tracking Clock Unit 201 of FIG. 2. The edge positions are reported by the DRU 202 of FIG. 2 via a set of vote signals vph[0:3] shown in FIG. 3. These signals can be considered as votes for a given clock phase. The vote signals are generated in the DRU 202 of FIG. 2, after subtracting the DJ component. This minimizes the DJ admitted to the averaging process, thereby improving the estimate of the mean zero crossing position.

The first stage of the averager (AVG) is a vote filter. This provides the ability to slow down/speed up the tracking process through a programmable interface. It will allow us to change with the minimum tracking rate required for channels with different characteristics.

Programmable tracking rate is achieved via two control bits rx_ctrl[1:2] in the control interface. We can use these bits to slow down the Shift Left/Shift Right (i.e. shift_dir [0:1]) commands that go to the barrel shifter. The shift_dir command will be either shift_left, shift_right or no_shift. The logic shall first determine the shift_dir command based on the current state of avg_zc[0:3] and the incoming vote vph[0:3]. Then it shall send these commands through a divide by n circuit, where n is determined by the control bits rx_ctrl[2:1]. For example, if we set rx_ctrl[2:1]='11', then it will require 4 consecutive shift_dir[0:1] commands in the same direction in order to issue one new command shft_dir to the barrel shifter.

The Averager 301 uses the history of the vote signals to produce the average zero crossing information avg_zc[0:3] for the DRU 202 of FIG. 2, as well as two control signals up and down to the Tracking Clock Generator (TCG) 302.

The up signal advances the phase of the generated signal clk_tr whereas the down signal delays the clk_tr phase. The time delay and advance operations of the clk_tr phase occur at the granularity of the minimum spacing between the clock phases clk_ph[0:3], and a sequence of such correction signals effectively changes the frequency of the clk_tr signal.

Figure 4:
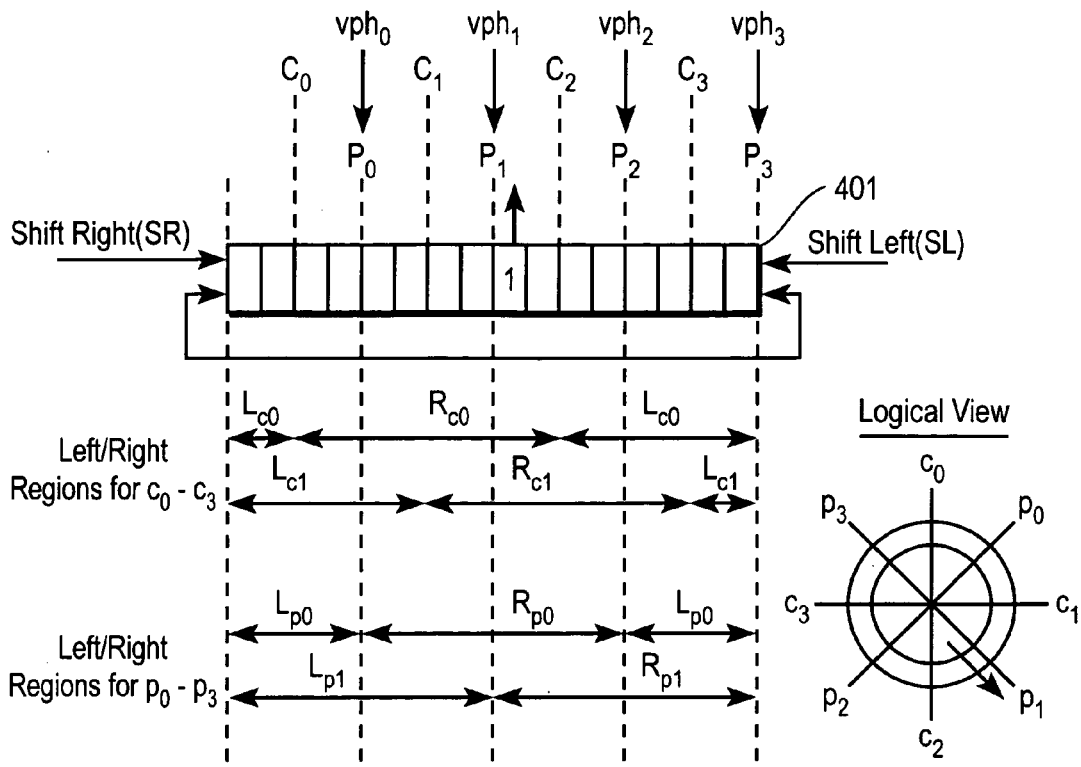
FIG. 4 depicts an exemplary embodiment of a barrel shifter according to yet another aspect of the invention.

The Averager 301 is a barrel shifter with a pointer to mark the mean zero crossing. It is essentially a shift register with the two ends connected to each other. Referring now to FIG. 4, the barrel shifter 401 possesses shift left (SL) and shift right (SR) functionality. Depending on the phase where an edge was reported, the pointer is moved closer to that phase. FIG. 4 shows the implementation and partitioning of the regions of the barrel shifter 401. In partitioning the barrel shifter 401, the length of the shift register is considered as a time interval equal to the bit period $T_b$ (or one unit interval, UI).

Two sets of fixed time reference points are assigned to barrel shifter 401. The first set $p_0$–$p_3$ corresponds to the phases of a multi-phase clock, e.g., four in the exemplary embodiment. Since any edges occurring in the region $p_i$–$p_{i+1}$ are reported at $p_{i+1}$ (assuming wraparound at i=3) that region is assigned to $p_{i+1}$. A second set of reference points, $c_0$–$c_3$, is used to identify the centers of the regions belonging to $p_0$–$p_3$. The second set of time reference points can be considered as further divisions of the clock phases, effectively giving increased granularity of 0.125 UI. Assignment of time references to the barrel shifter locations permits movement of a pointer to a given reference depending on the clock phase that reported the edge, thereby affording the phase tracking ability required.

For example, an edge that was reported on phase $p_3$ indicates that the edge occurred in the region $p_2$–$p_3$. The center of this region is $c_3$. Therefore, the pointer is moved towards $c_3$. However, since the shifter is connected in circular fashion, the current location of the pointer determines the closest direction to $c_3$. This gives rise to the definition of left and right regions for each of the reference points defined above. These regions are shown in FIG. 4. It should be noted that in assigning the regions the left/right regions, the total circular length of the barrel shifter 401 is cut in half about the reference point. For example, $L_{c3}$ indicates that the region left of point $c_3$. It also indicates that that if the pointer is in the left region of a particular reference point, the closest direction to that reference point is right. In the example outlined above, if the pointer was located in the region $L_{c3}$, and an edge was reported on phase $p_3$, the pointer would shift right.

At power on, the averager resets all locations to "0". When the first zero crossing information is received, the pointer is loaded to the location where the zero crossing was reported. Subsequent zero crossings eventually cause the pointer to follow the mean (or average) zero crossing. The amount of averaging history retained and therefore, the tracking speed, is a function of the length of the barrel shifter 401. As the length increases, more edges are required in a single direction to move the pointer between two adjacent phase positions. Accordingly, it is necessary to select a barrel shifter length long enough not to cause spurious phase selection due to random jitter. On the other hand, the selected length should be short enough to track the long-term frequency drift between the transmitter and receiver clocks.

The conditions for shifting the pointer of barrel shifter 401 in either direction now follow. Assuming that there is a set of active high signals corresponding to the left and right regions in a manner such that the signal $L_{ci}$ will be high when the pointer is in the region $L_{pi}$. Similarly, the signal $L_{ci}$ will be high when the pointer is in the region $L_{ci}$.

The following relationships are derived from FIG. 4:

$$L_{ci}=R_{ci} \quad L_{pi}=R_{pi}$$

$$L_{co}=L_{c2} \quad L_{c1}=L_{c3}$$

$$L_{po}=L_{p2} \quad L_{p1}=L_{p3}$$

Assume that the edges are signaled by a set of signals $vph_0$–$vph_3$, as indicated in FIG. 4. By way of example, the signal $vph_2$ indicates that an edge was reported by phase 2. From this the control signals SR and SL for the shifter can be constructed as follows:

$$SR=\Sigma(vph \cdot L_{ci})$$

$$SL=\Sigma(vph \cdot L_{ci})$$

Thus, the barrel shifter 401 of the invention provides two pieces of information:

The position $P_i$ closest to the mean zero crossing, denoted by $P_w$; and

The position $C_i$ closest to the mean zero crossing, denoted by $C_w$.

$P_w$ indicates the clock phase that is closest to the mean zero crossing, while $C_w$ indicates whether the mean zero crossing happened early or late with respect to $P_w$. These two values provide the position of the mean zero crossing to an accuracy of +/− 0.0625 UI.

TABLE 0-1

Truth Tables for $C_w$ and $P_w$

| $L_{p1}$ | $L_{p0}$ | $C_w$ | $L_{c1}$ | $L_{c0}$ | $P_w$ |
|---|---|---|---|---|---|
| 0 | 0 | $C_2$ | 0 | 0 | $P_1$ |
| 0 | 1 | $C_3$ | 0 | 1 | $P_2$ |
| 1 | 0 | $C_1$ | 1 | 0 | $P_0$ |
| 1 | 1 | $C_0$ | 1 | 1 | $P_3$ |

In the final implementation, $P_w$ is conveyed in the signals avg_z[0.3] while the early/late signal indicates if the true mean is early/late with respect to the avg_zc[0:3]. The early/late indication is used in the data recovery to further enhance the bit decisions.

In addition to providing the average zero crossing location, the TCU also gives a measure of the long long-term drift by providing drop and add signals. The idea here is to signal the DRU when the slip between the local and remote clocks accumulates up to one whole bit period. This means that the pointer in the barrel shifter has rotated one complete circle. The direction of the movement will tell us if the local clock is faster or slower than the remote clock. Thus, with reference to the logical view of the barrel shifter of FIG. 4., the signals are generated as follows:

1. drop: if the avg_zc moves from ph1->ph2->ph3->ph0->ph1, the local clock is faster than the remote clock, and when the avg_zc crosses from ph0->ph1, we have advanced one whole bit period. If we were decoding data using a fixed amount of samples (fixed rate decoding), we need to drop one bit at this point (i.e. decode one less bit using the same set of samples) in order to match the data rate of the remote transmitter.

2. add: if the avg_zc moves from ph0->ph3->ph2->ph1->ph0, the local clock is slower than the remote clock, and when the avg_zc crosses from ph1->ph0, we have slipped one whole bit period. If we were decoding data using a fixed amount of samples (fixed rate decoding), we need to add one bit at this point (i.e. decode one extra bit using the same set of samples) in order to match the data rate of the remote transmitter.

It should be noted that in this implementation, the trigger point for drop/add has been arbitrarily selected at the ph0->ph1 boundary. However this can be any of the four boundaries.

Figure 5:
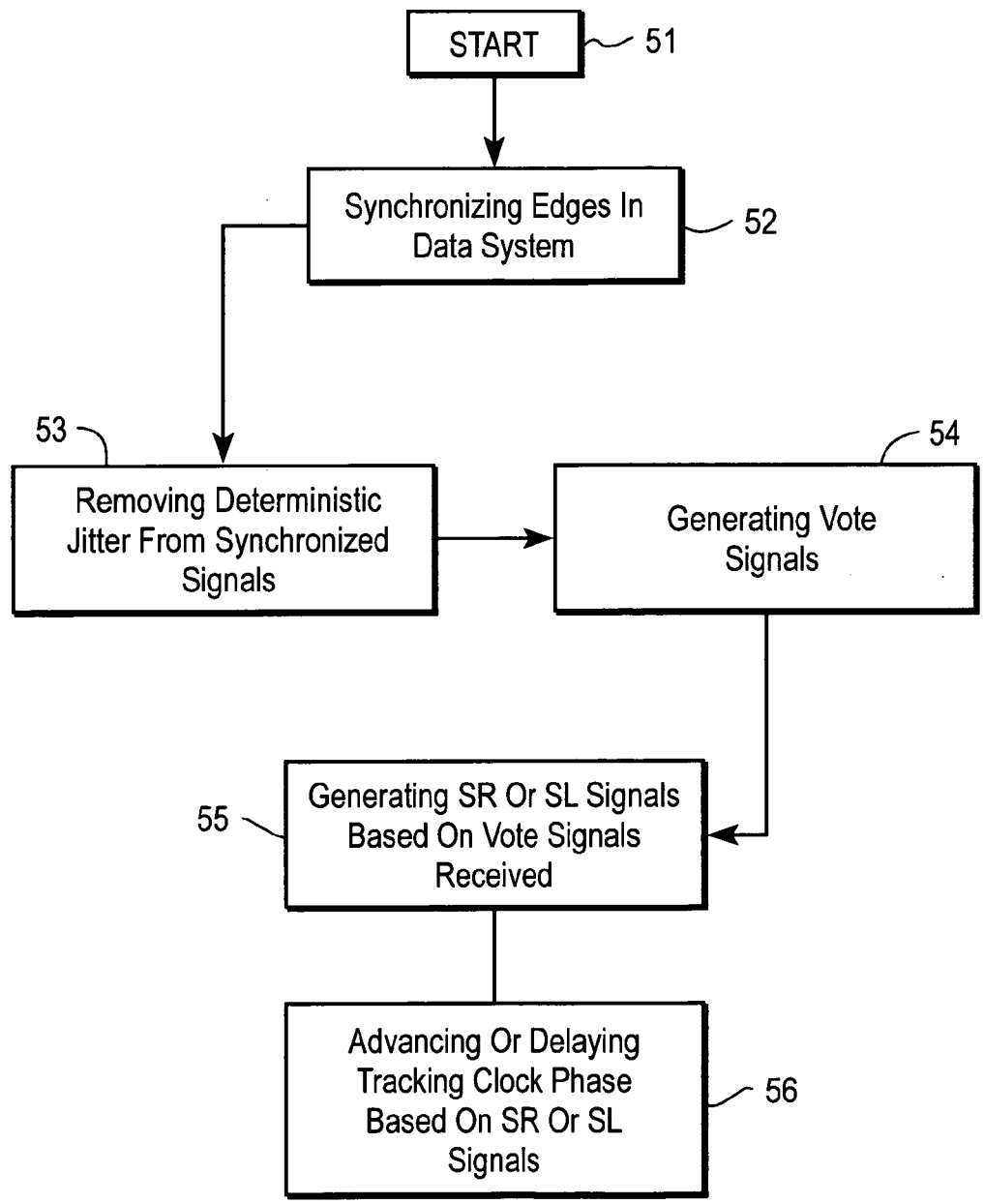
FIG. 5 depicts a block diagram of an exemplary method according to one aspect of the invention.

In a preferred embodiment 50 therefore shown in FIG. 5, the present invention alters the tracking clock phase according to the following steps:

(i) Step 52: Edge signals edge and edge# are received by SAU 203 which synchronizes the edge signals and generates signals sau_ph0 [0:7] and sau_ph0#[0:7] (FIG. 2);

(ii) Step 53: Signals sau_ph0[0:7] and sau_ph0#[0:7] generated by SAU 203 are received by DRU 202, which subtracts the DJ component from the received signals and generates votes vph[0:3] (FIG. 2);

(iii) Step 54: Vote signals vph[0:3] generated by DRU 202 are received by AVG 301, which generates control signals Shift Right (SR) or Shift Left (SL) (Step 55), depending on the vote signal received and zero crossing information avg_zc[0:3]. Control signals SR and SL correspond to up or down signals, which are transmitted to TCG 302 (FIG. 3).

(iv) Step 56: TCG 302 receives signals up and down and generates signals clk_tr, and clk_tr#. The up signal advances the phase of the tracking clock while the down signal delays the phase (FIG. 3).

The steps 51–56 described above are summarized in FIG. 5.

The invention described herein can be employed between any two components communicating with each other, particularly doing so at high speed and using serial data. Referring to FIGS. 6a–d, examples of possible applications include, but are not limited to, server to server communications (such as modules MOD A 144 and MOD B 145 in FIG. 6c, in which the modules represent servers), distributed network communications (as shown by networked computers 141 and 142 in FIG. 6b connected via a distributed network 143, such as the Internet), local area network (LAN) communications (as shown by PCs A 146, B 148 and C 147 coupled by a LAN in FIG. 6d) component to component communication within a computer or computer system, such as a server or personal computer, as shown by CPU 136, modem 138, CD-ROM 139, disk drive 140 and secondary CPU 137 in FIG. 6a, which may be connected by legacy I/O or an I/O fabric) router to router communications (as shown by modules MOD A 144 and MOD B 145 in FIG. 6c, in which case the modules are routers), and communications between telephone switches and multiplexers, both optical and electrical (as shown by modules A 144 and B 145 in FIG. 6c, in which case the modules are telephone switches and/or multiplexers). Moreover, any communications in a modularized computer system can be performed using the method and apparatus described herein.

Although a preferred embodiment is specifically illustrated and described herein, it will be appreciated that modifications and variations of the invention are covered by the above teachings and within the purview of the appended claims without departing from the spirit and intended scope of the invention. For example, while a preferred embodiment depicts the use of four clock phases, other numbers (n) of clock phases will suffice, such as as few as two and more than four. Furthermore, while an embodiment uses differential coding, any coding scheme, or no coding, will suffice. These examples should not be interpreted to limit the modifications and variations of the invention covered by the claims but are merely illustrative of possible variations.

All the features disclosed in this specification (including any accompanying claims, abstract and drawings), and/or all of the steps or any method or process so disclosed, may be combined in any combination, except combinations where at least some of the features and or steps are mutually exclusive. Each feature disclosed in this specification (including any accompanying claims, abstract and drawings) may be replaced by alternative features serving the same equivalent or similar purpose, unless expressly stated otherwise. Thus unless expressly stated otherwise, each feature disclosed is one example only of a generic series of equivalent or similar features.

Moreover, although various embodiments are specifically illustrated and described herein, it will be appreciated that modifications and variations of the invention are covered by the above teachings and within the purview of the appended claims without departing from the spirit and intended scope of the invention. For example, while several of the embodiments depict the use of four clock phases, other numbers (n) of clock phases will suffice, such as as few as two and more than four. In addition, while some of the above embodiments use a barrel shifter to perform the digital averaging of the clock phases of the received edges, any technique for calculating the moving average will suffice. Furthermore, while some of the above embodiments use differential coding, any coding scheme, or no coding, will suffice. These examples should not be interpreted to limit the modifications and variations of the invention covered by the claims but are merely illustrative of possible variations.

What is claimed is:

1. A receiver for receiving data comprising:
   an edge processor operative to make decisions using a plurality of edges of a received data stream;
   a multi-phase clock outputting a plurality of clock phases; and
   a digital averager coupled to the edge processor and the multi-phase clock and operative to select one of the plurality of clock phases for use by the edge processor, wherein said digital averager includes a barrel shifter comprising
   (i) a finite length;
   (ii) at least one set of reference points corresponding to the plurality of phases of the multi-phase clock, said at least one set of reference points being disposed along said finite length; and
   (iii) a movable pointer for selecting one of said reference points in said set of reference points in response to a signal, wherein said movable pointer moves from a current position in said set of reference points to a new position in said set of reference points based on a characteristic of said signal.

2. The receiver according to claim 1, wherein said finite length of said barrel shifter describes a circle.

3. The receiver according to claim 1, wherein said at least one set of reference points comprises a first set and a second set.

4. The receiver according to claim 3, wherein said first set comprises a set of reference points corresponding to the plurality of phases of multi-phase clock and said second set of reference points comprises a plurality of midpoints of said first set of reference points.

5. The receiver according to claim 1, wherein said movable pointer moves bi-directionally.

6. The receiver according to claim 1, wherein said movable pointer moves right and left.

7. The receiver according to claim 1, wherein said signal corresponds to one of the plurality of edges of the received data stream.

8. The receiver according to claim 1, wherein said finite length of said barrel shifter corresponds to a time interval of one unit interval.

9. A device for tacking phase or frequency comprising:
a clock generator outputting a plurality of clock phases;
a digital averager to receive data corresponding to a plurality of edges of an input data waveform and to generate a control signal in response to said input data waveform, wherein said digital averager comprises a barrel shifter that is operative to select one of the plurality of clock phases for use in a subsequent decision process, said barrel shifter further comprising:
(i) a finite length;
(ii) at least one set of reference points corresponding to the plurality of phases of the multi-phase clock, said at least one set of reference points being disposed along said finite length; and
(iii) a movable pointer for selecting one of said reference points in said set of reference points in response to a signal, wherein said movable pointer moves from a current position in said set of reference points to a new position in said set of reference points based on a characteristic of said signal; and
a tracking clock generator coupled to the digital averager to receive said control signal and correspondingly adjust a phase of the clock generator.

10. The device according to claim 9, wherein said finite length of said barrel shifter describes a circle.

11. The device according to claim 9, wherein said at least one set of reference points comprises a first set and a second set.

12. The device according to claim 11, wherein said first set comprises a set of reference points corresponding to the plurality of phases of the multi-phase clock and said second set of reference points comprises a plurality of midpoints of said first set of reference points.

13. The device according to claim 9, wherein said movable pointer moves bi-directionally.

14. The device according to claim 9, wherein said movable pointer moves right and left.

15. The device according to claim 9, wherein said signal corresponds one of the plurality of edges of the input data waveform.

16. The device according to claim 9, wherein said finite length of said barrel shifter corresponds to a time interval of one unit interval.

* * * * *